United States Patent
Yoo (10) Patent No.: US 7,019,556 B2
(45) Date of Patent: Mar. 28, 2006

(54) SEMICONDUCTOR MEMORY DEVICE CAPABLE OF ADJUSTING IMPEDANCE OF DATA OUTPUT DRIVER

(75) Inventor: Seong-Jong Yoo, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 34 days.

(21) Appl. No.: 10/882,486

(22) Filed: Jun. 30, 2004

(65) Prior Publication Data

US 2005/0057981 A1 Mar. 17, 2005

(30) Foreign Application Priority Data

Aug. 25, 2003 (KR) .................. 10-2003-0058733

(51) Int. Cl.
*H03K 19/003* (2006.01)
(52) U.S. Cl. .................. 326/30; 326/26; 365/189.05
(58) Field of Classification Search .......... 326/30
See application file for complete search history.

(56) References Cited

U.S. PATENT DOCUMENTS

| 5,629,634 | A | 5/1997 | Carl et al. |
|---|---|---|---|
| 5,729,157 | A | 3/1998 | Monk et al. |
| 5,995,440 | A | 11/1999 | Lewis et al. |
| 6,118,310 | A | 9/2000 | Esch, Jr. |
| 6,184,749 | B1 | 2/2001 | Hsiao |
| 6,330,194 | B1 * | 12/2001 | Thomann et al. ...... 365/189.05 |
| 6,337,834 | B1 | 1/2002 | Isobe et al. |
| 6,373,286 | B1 | 4/2002 | Loeffler et al. |
| 6,456,124 | B1 | 9/2002 | Lee et al. |
| 6,462,591 | B1 | 10/2002 | Garrett, Jr. et al. |
| 6,469,539 | B1 | 10/2002 | Kim |
| 6,556,052 | B1 | 4/2003 | Garrett, Jr. et al. |
| 6,919,738 | B1 * | 7/2005 | Kushida ...................... 326/82 |
| 6,924,660 | B1 * | 8/2005 | Nguyen et al. ............... 326/30 |
| 2001/0007115 | A1 | 7/2001 | Yim et al. |

FOREIGN PATENT DOCUMENTS

| JP | 09-064720 | 3/1997 |
|---|---|---|
| JP | 2001-144821 | 5/2001 |

* cited by examiner

*Primary Examiner*—James H. Cho
(74) *Attorney, Agent, or Firm*—Blakely, Sokoloff, Taylor & Zafman (57) ABSTRACT

A semiconductor memory device comprises a data input/output pad; a data input unit for buffering and latching a data signal inputted through the data input/output pad during a data access operation, or for buffering and latching an OCD control code signal inputted through the data input/output pad during the OCD calibration control operation; a data align unit for aligning the data signal latched by the data input unit and transferring the aligned data signal to a memory core during the data access operation, or for aligning and outputting the OCD control code signal latched by the data input unit during the OCD calibration control operation; a data output driver for outputting and driving the data signal outputted from the memory core; and an OCD control unit for decoding the OCD control code signal outputted from the data align unit to thereby adjust an output impedance of the data output driver.

8 Claims, 10 Drawing Sheets

SEMICONDUCTOR MEMORY DEVICE CAPABLE OF ADJUSTING IMPEDANCE OF DATA OUTPUT DRIVER

FIELD OF THE INVENTION

The present invention relates to a semiconductor memory device; and, more particularly, to a semiconductor memory device capable of adjusting a data output driver impedance.

DESCRIPTION OF THE PRIOR ART

A dynamic random access memory (DRAM) has been improved continuously to increase its operational speed. Synchronizing an internal clock signal with an external clock signal is one of methods to improve an operational speed of the DRAM. The DRAM which is operated in synchronization with the external clock signal is called a synchronous dynamic random access memory (SDRAM).

The SDRAM performs a data access operation at a rising edge of the external clock signal. That is, the SDRAM can perform the data access operation once within one cycle of the external clock signal.

Such an SDRAM that performs the data access operation once within one cycle of the external clock signal is particularly called a single data rate (SDR) SDRAM.

However, the SDR SDRAM had to be more improved for use in a high speed system. Therefore, a double data rate (DDR) SDRAM has been developed. The DDR SDRAM performs the data access operation at a rising edge and a falling edge of the external clock signal. That is, the DDR SDRAM performs the data access operation twice within one cycle of the external clock signal.

A double data rate 2 (DDR2) SDRAM is an upgraded version of the DDR SDRAM.

For enhancing an operational speed of the DDR2 SDRAM, new concepts have been proposed by an international electronics standardization organization, namely the Joint Electron Device Engineering Council (JEDEC). An off chip driver (OCD) calibration control is one of the proposed new concepts.

The OCD calibration control means adjusting an impedance of data output drivers to have an optimized data output driver impedance. The optimized data output driver impedance can be found by measuring a current flown from an external device such as a chipset to the data output driver or a voltage between the chipset and the data output driver.

Therefore, for that purpose described above, the DDR2 SDRAM should have an ability of adjusting the impedance of data output drivers.

Figure 1:
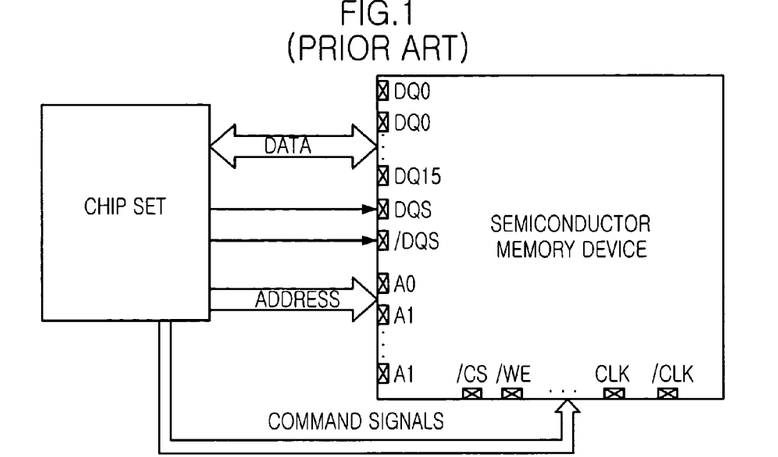
FIG. 1 is a block diagram showing a data interface between a chipset and a conventional DDR SDRAM.

FIG. 1 is a block diagram showing a data interface between a chipset and a conventional DDR SDRAM.

The data interface shown in FIG. 1 shows roughly how data access operation is performed.

As shown, the conventional DDR SDRAM receives a plurality of command signals such as a chip selection bar signal/CS, a write enable bar signal/WE, a clock signal CLK and a clock bar signal/CLK from the chipset. The conventional DDR SDRAM also receives a plurality of address signals A0 to A15. In addition, the conventional DDR SDRAM receives or outputs data through a plurality of data output pins DQ0 to DQ15.

The conventional DDR SDRAM receives or outputs a data strobe signal DQS and its inverted signal, namely a data strobe bar signal/DQS through a data strobe input pin. The data strobe signal DQS repeatedly changes its logic level by periods while the data access operation is performed. The conventional DDR SDRAM aligns an inputted data using the data strobe signal DQS and transfers the aligned data to the inside of the DDR SDRAM.

Figure 2:
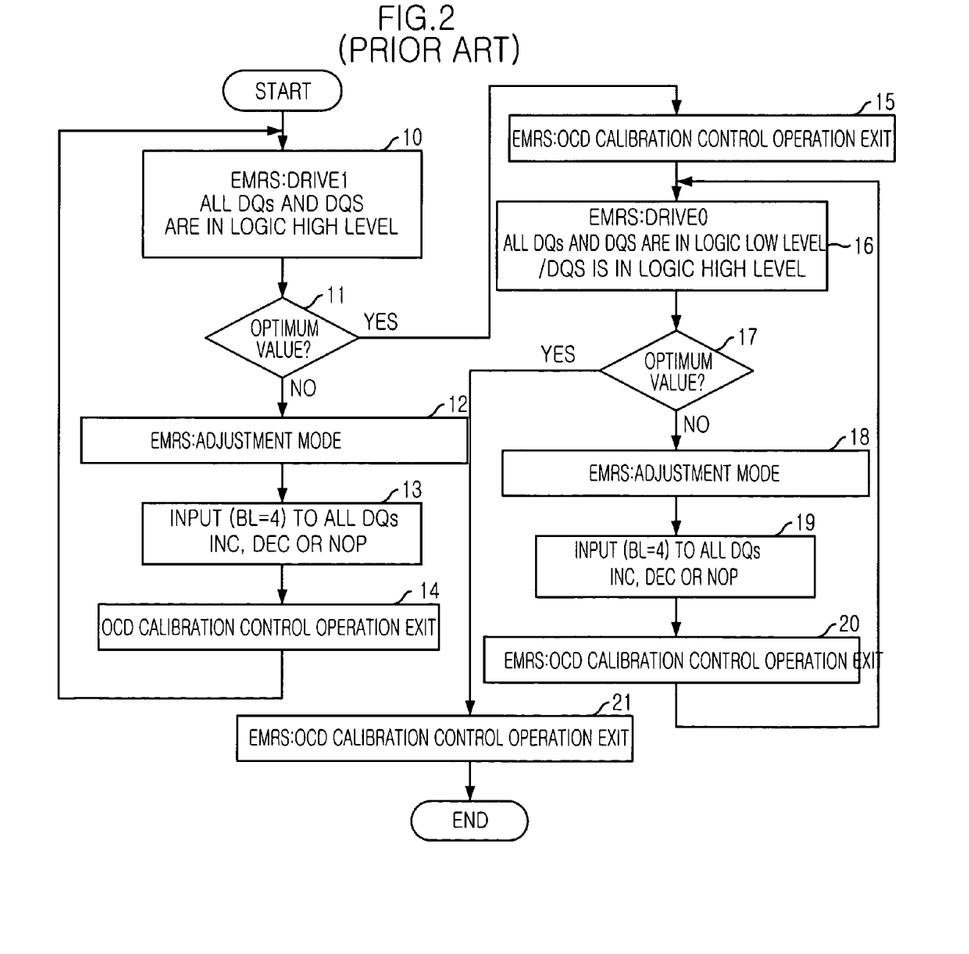
FIG. 2 is a flow chart showing an operational sequence of performing an OCD calibration control mode proposed by the JEDEC.

FIG. 2 is a flow chart showing an operational sequence of performing an OCD calibration control operation proposed by the JEDEC. Each step for the operational sequence is marked by step numbers from 10 to 21.

The operational sequence is roughly divided into two steps, i.e., a first step for measuring an output impedance of a data output driver and a second step for adjusting the output impedance.

The data output driver includes a pull-up driver and a pull-down driver, and activates one of those drivers to output a data. That is, the data output driver outputs the data as a logic high level through the pull-up driver and outputs the data as a logic low level through the pull-down driver. Therefore, the output impedance should be measured by measuring an output impedance of the pull-up driver or an output impedance of the pull-down driver. In a first drive mode DRIVE1, the output impedance of the pull-up driver is measured, and, in a second drive mode DRIVE0, the output impedance of the pull-down driver is measured.

The operational sequence of performing the OCD calibration control operation is described below referring to FIG. 2.

After an extended mode register set (EMRS) enters into the OCD calibration control operation, the EMRS sets a drive mode to the first drive mode DRIVE1. Then, outputs of all data output pins (DQ pins) and the data strobe signal DQS become in a logic high level, and an output of the data strobe bar signal/DQS becomes in a logic low level as shown in the step 10.

Herein, in the first drive mode DRIVE1, the output impedance of the data output driver is measured when the pull-up driver outputs the data as a logic high level. The EMRS serves to control various operations of the conventional DDR SDRAM.

Thereafter, the chipset measures the output impedance of the pull-up driver. If the measured output impedance is an optimum value for a current system status, the EMRS sets the drive mode to the second drive mode DRIVE0 as shown in the step 16. If the measured output impedance is not the optimum value for the current system status, the EMRS enters into an adjustment mode for adjusting the measured output impedance of the pull-up driver as shown in the step 12.

In the adjustment mode, the output impedance of the pull-up driver is increased or decreased by decoding a burst code to thereby adjust the output impedance of the pull-up driver. Herein, a burst length (BL) is set to 4 bits and the burst code is outputted by the chipset.

In the adjustment mode, the output impedance of the pull-up driver is adjusted by varying the number of turned-on pull-up MOS transistors among whole pull-up MOS transistors included in the pull-up driver.

Thereafter, the EMRS exits from the OCD calibration control mode as shown in the step 14, then, the EMRS sets the drive mode to the first drive mode DRIVE1 for measuring the output impedance of the pull-up driver again as shown in the step 10.

If the output impedance of the pull-up driver is not the optimum value, the output impedance of the pull-up driver is adjusted by the same way described above.

If the output impedance of the pull-up driver is the optimum value, the output mode of the EMRS changed to the second drive mode DRIVE0 as shown in the step 16.

In the second drive mode DRIVE0, the output impedance of the data output driver is measured when the pull-down driver outputs the data as a logic low level.

Thereafter, the chipset measures the output impedance of the pull-down driver. If the measured output impedance is an optimum value for the current system status, the EMRS exits from the OCD calibration control operation as shown in the step 21.

On the other hand, if the measured output impedance is not the optimum value for the current system status, the EMRS enters into the adjustment mode for adjusting the measured output impedance of the pull-down driver as shown in the step 18. Then, steps 19, 20, 16 and 17 are performed continuously until the measured output impedance of the pull-down driver becomes the optimum value.

Figure 3A:
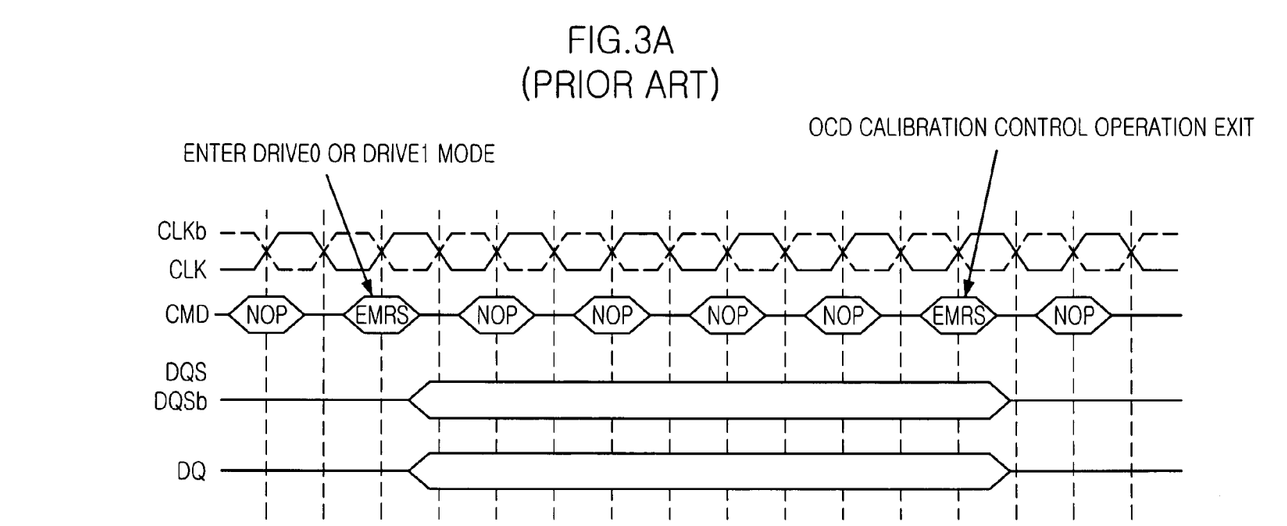
FIG. 3A is a timing diagram showing an operation of measuring an output impedance of a data output driver.

FIG. 3A is a timing diagram showing an operation of measuring the output impedance of the data output driver while the OCD calibration control operation is performed.

Figure 3B:
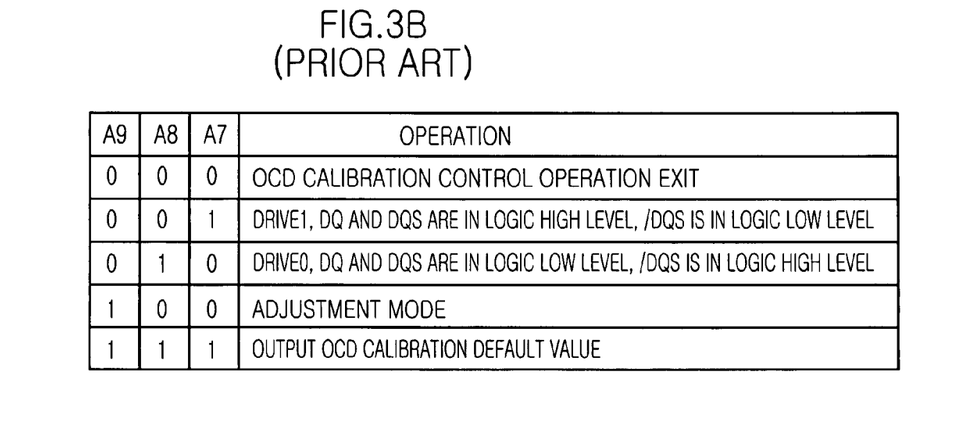
FIG. 3B is an operation table showing an operation of performing the OCD calibration control mode in response to a 3-bit control signal.

FIG. 3B is an operation table showing an operation of performing the OCD calibration control operation in response to a 3-bit control signal inputted to address pins A7, A8 and A9.

The operation of measuring the output impedance of the data output driver is described in detail referring to FIGS. 3A and 3B.

Firstly, the chipset inputs the 3-bit control signal to the conventional DDR SDRAM for the output mode of the EMRS to be the first drive mode DRIVE1 or the second driver mode DRIVE0.

Herein, the 3-bit control signal is inputted to the address pins A7 to A9 as above mentioned. An operational status of the OCD calibration control operation according to the 3-bit control signal is shown in the operation table.

For example, if the 3-bit control signal is inputted as 001 or 010, the output mode of the EMRS becomes the first driver mode DRIVE1 or the second drive mode DRIVE0 respectively. If the 3-bit control signal is inputted as 100, the output mode of the EMRS becomes the adjustment mode, or if the 3-bit control signal is inputted as 111, the output impedance of the data output driver keeps a default impedance value.

In the first drive mode DRIVE1, the data output driver outputs the data as a logic high level through the pull-up driver and the output impedance of the pull-up driver is measured.

In the second drive mode DRIVE0, the data output driver outputs the data as a logic low level through the pull-down driver and the output impedance of the pull-down driver is measured.

Figure 4A:
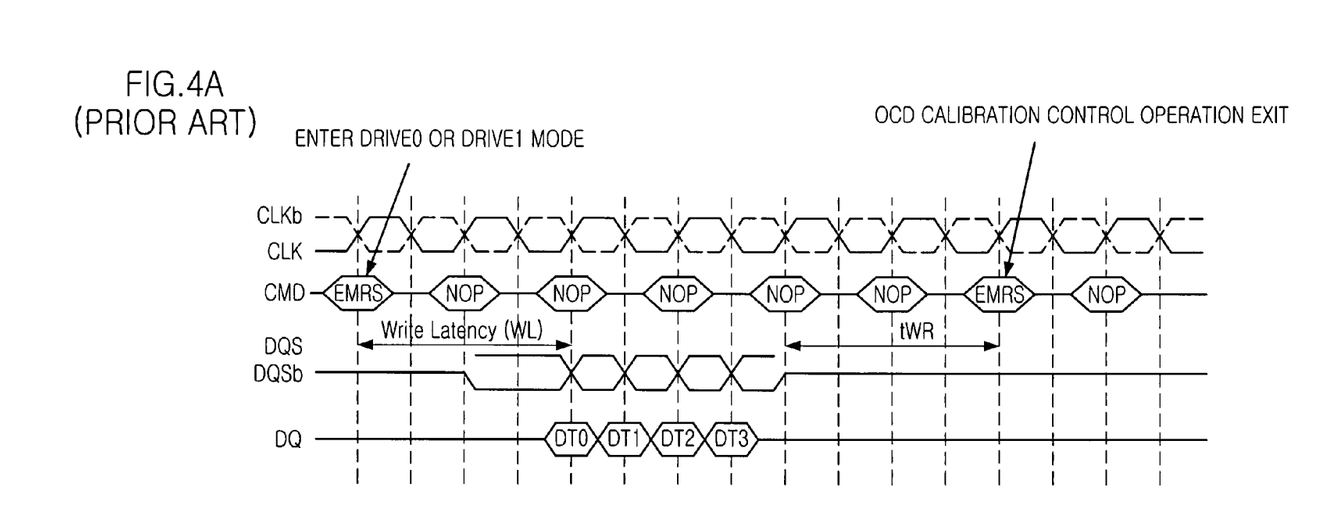
FIG. 4A is a timing diagram showing an operation of adjusting the output impedance of the data output driver.

FIG. 4A is a timing diagram showing an operation of adjusting the output impedance of the data output driver while the OCD calibration control mode is performed.

Figure 4B:
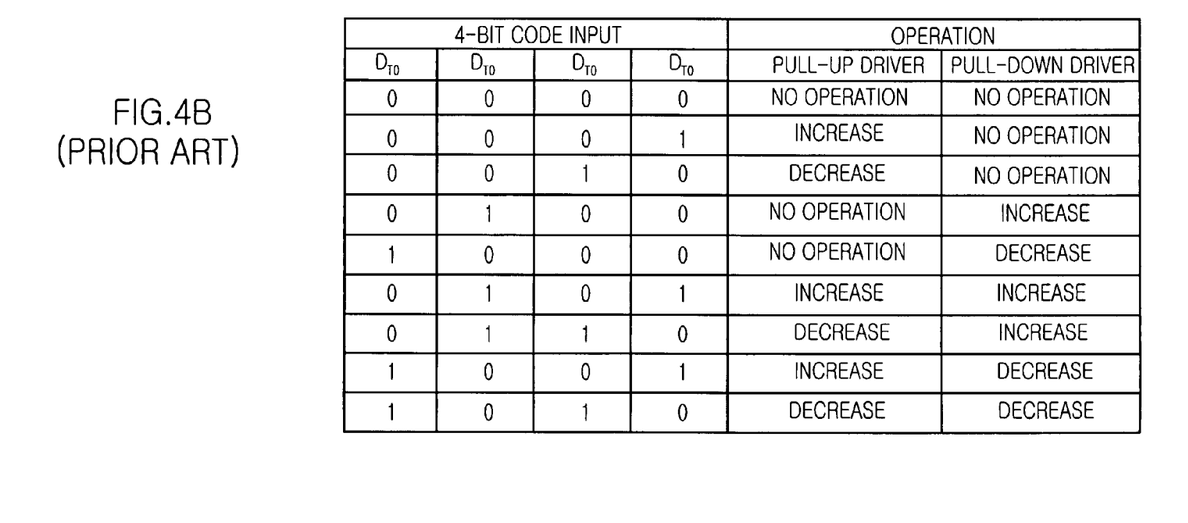
FIG. 4B is an operation table showing an operation of performing the OCD calibration control mode in response to a burst code.

FIG. 4B is an operation table showing the OCD calibration control operation according to the burst code.

The operation of adjusting the output impedance of the data output driver is described in detail referring to FIGS. 4A and 4B.

After the output mode of the EMRS becomes the adjustment mode, the chipset inputs the 4-bit burst code to the conventional DDR SDRAM through the DQ pins.

The operation table shown in FIG. 4B shows the operation in the adjustment mode according to the 4-bit burst code.

The operation in the adjust mode is performed by controlling turning on/off MOS transistors included in the data output driver.

For example, if the burst code is inputted as "1000", one of turned-on MOS transistors in the pull-down driver is turned-off. If the burst code is inputted as "1001", the number of turned-on MOS transistors in the pull-up driver is increased by one and the number of turned-on MOS transistors in the pull-down driver is decreased by one.

After the adjustment mode is completed, the OCD calibration control operation is finished.

However, the conventional DDR SDRAM does not include a device for performing the OCD calibration control operation. Therefore, a new device for the OCD calibration control mode is needed.

SUMMARY OF THE INVENTION

It is, therefore, an object of the present invention to provide a semiconductor memory device having ability of adjusting an output impedance of a data output driver.

In accordance with an aspect of the present invention, there is provided a semiconductor memory device including a data input/output pad; a data input unit for buffering and latching a data signal inputted through the data input/output pad during a data access operation, or for buffering and latching an OCD control code signal inputted through the data input/output pad during the OCD calibration control operation; a data align unit for aligning the data signal latched by the data input unit and transferring the aligned data signal to a memory core during the data access operation, or for aligning and outputting the OCD control code signal latched by the data input unit during the OCD calibration control operation; a data output driver for outputting and driving the data signal outputted from the memory core; and an OCD control unit for decoding the OCD control code signal outputted from the data align unit to thereby adjust an output impedance of the data output driver.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a synchronous semiconductor memory device in accordance with the present invention will be described in detail referring to the accompanying drawings.

Figure 5:
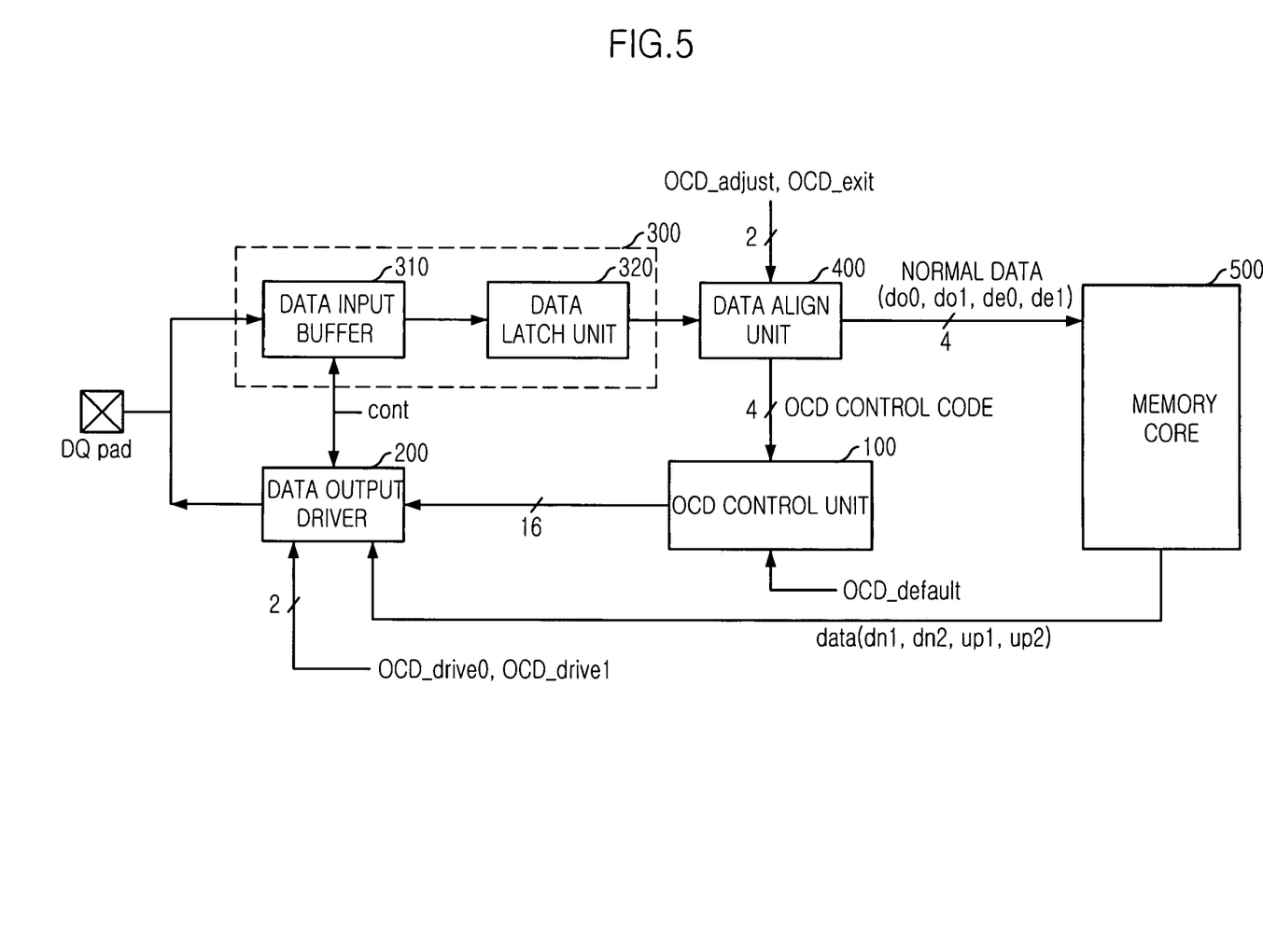
FIG. 5 is a block diagram showing a synchronous semiconductor memory device in accordance with a preferred embodiment of the present invention.

FIG. 5 is a block diagram showing a synchronous semiconductor memory device in accordance with a preferred embodiment of the present invention.

As shown, the synchronous semiconductor memory device includes a data input/output pad (DQ pad), a data input unit 300, a data align unit 400, a data output driver 200, an OCD control unit 100 and a memory core 500.

The data input unit 300 buffers and latches a data signal inputted through the DQ pad when the synchronous semiconductor memory device performs a data access operation, or buffers and latches a 4-bit OCD control code signal inputted through the DQ pad when the synchronous semiconductor memory device performs an OCD calibration control operation.

The data align unit 400 receives the data signal latched by the data input unit 300 in order to align the data signal and transfer the aligned data signal as a normal data signal to the memory core 500 during the data access operation, or receives the 4-bit OCD control code signal latched by the data input unit 300 in order to align the 4-bit OCD control code signal and output the aligned 4-bit OCD control code signal to the OCD control unit 100.

Herein, the normal data signal is a 4-bit signal, each bit marked as do0, do1, de0 and de1 respectively as shown in FIG. 5.

The data output driver 200 outputs and drives the data signal outputted from the memory core 500 to the DQ pad.

The OCD control unit 100 decodes the 4-bit OCD control code signal outputted from the data align unit 400 to thereby adjust an output impedance of the data output driver 200.

The data input unit 300 includes a data input buffer 310 and a data latch unit 320.

The data input buffer 310 serves to buffer the data signal or the 4-bit OCD control code signal outputted from the DQ pad. The data input buffer 320 serves to latch the data signal or the 4-bit OCD control code signal buffered by the data input buffer 310.

Figure 6:
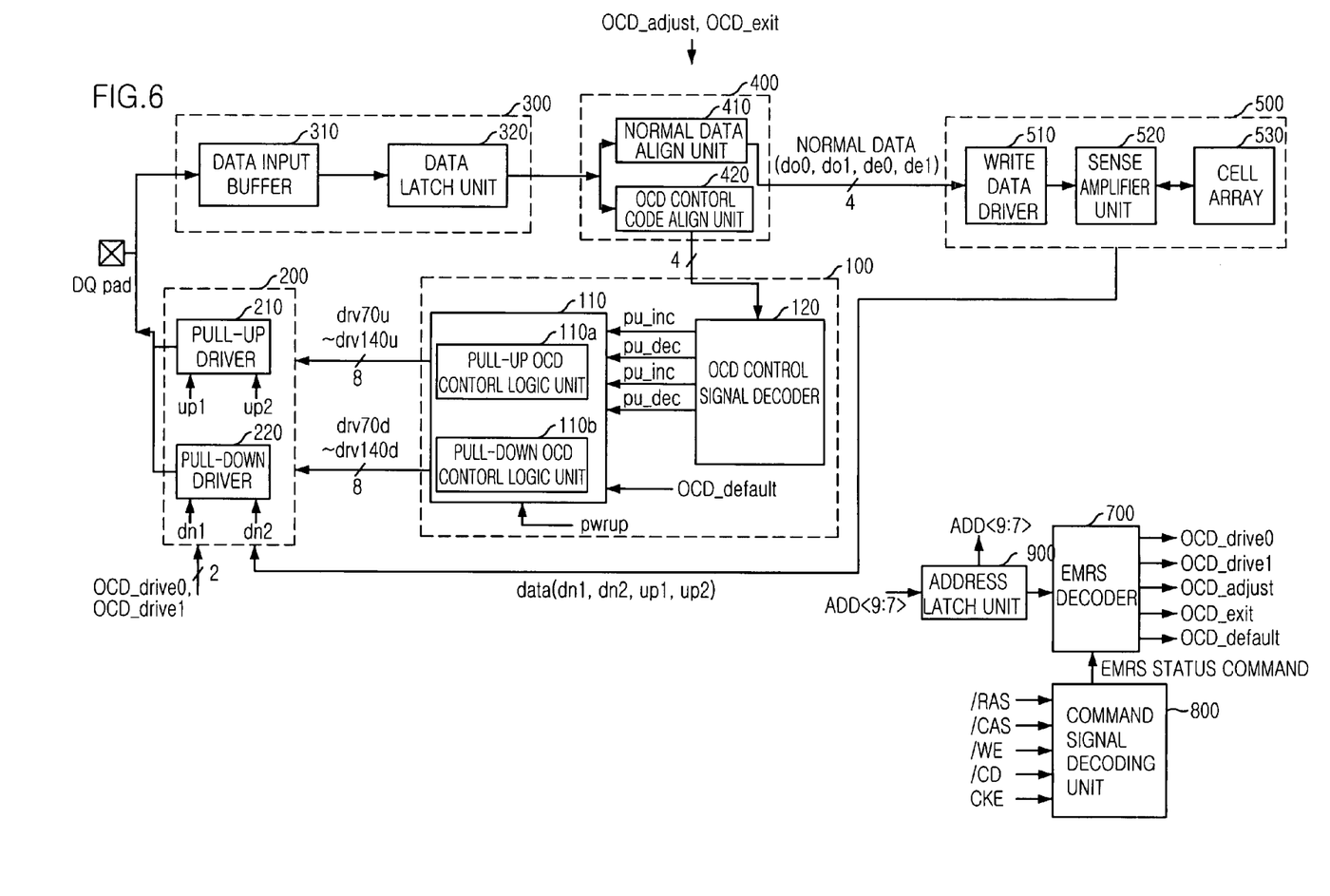
FIG. 6 is a block diagram showing the synchronous semiconductor memory device shown in FIG. 5 in detail.

FIG. 6 is a block diagram showing the synchronous semiconductor memory device shown in FIG. 5 in detail.

As shown, the data align unit 400 includes a normal data align unit 410 and an OCD control code align unit 420.

The normal data align unit 410 receives the data signal from the data latch unit 320 to align the data signal and output the aligned data signal to the memory core 500. The OCD control code align unit 420 receives the 4-bit OCD control code signal from the data latch unit 320 to align the 4-bit OCD control code signal and output the aligned 4-bit OCD control code signal to the memory core 500.

The OCD control unit 100 includes an OCD control logic unit 110 and an OCD control code signal decoder 120.

The OCD control code signal decoder 120 decodes the 4-bit OCD control code signal outputted from the data align unit 400 to thereby generate a pull-up increase signal pu_inc, a pull-down increase signal pd_inc, a pull-up decrease signal pu_dec and a pull-down decrease signal pd_dec. Herein, the pull-up increase signal pu_inc and the pull-down increase signal pd_inc serve to increase the output impedance of the data output driver 200, and the pull-up decrease signal pu_dec and the pull-down decrease signal pd_dec serve to decrease the output impedance of the data output driver 200.

The OCD control logic unit 110 includes a pull-up OCD control logic unit 110a and a pull-down OCD control logic unit 110b.

The pull-up OCD control logic unit 110a generates a first to an eighth pull-up driver impedance adjust signals drv70u to drv140u in response to the pull-up increase signal pu_inc and the pull-up decrease signal pu_dec to thereby adjust an output impedance of a pull-up driver 210.

The pull-down OCD control logic unit 110b generates a first to an eighth pull-down driver impedance adjust signals drv70d to drv140d in response to the pull-down increase signal pd_inc and the pull-down decrease signal pd_dec to thereby adjust an output impedance of a pull-down driver 220.

The data output driver 200 is provided with a plurality of MOS transistors and controls the number of turned-on MOS transistors among the plurality of MOS transistors in response to the first to the eighth pull-up driver impedance adjust signals drv70u to drv140u and the first to the eighth pull-down driver impedance adjust signals drv70d to drv140d.

The data output driver 200 includes the pull-up driver 210 and the pull-down driver 220.

The pull-up driver 210 serves to output logic high level data signals up1 and up2 through the DQ pad and the pull-down driver 220 serves to output logic low level data signals dn1 and dn2 through the DQ pad.

The memory core 500 includes a write data driver 510, a sense amplifier unit 520 and a memory cell array 530.

The write data driver 510 receives the normal data signal to transfer the normal data signal to the sense amplifier unit 520. The sense amplifier unit 520 serves to amplify the normal data signal and the amplified normal data signal is stored in a selected memory cell in the memory cell array 530.

The synchronous semiconductor memory device further includes an EMRS decoder 700, a command signal decoder 800 and an address latch unit 900.

The address latch unit 900 latches a 3-bit control code through address pins ADD<9:7> and the EMRS decoder 700 receives and decodes the 3-bit control code for controlling the data output driver 600, the data align unit 400 and the OCD control unit 100.

The command signal decoder 800 receives a plurality of command signals such as a row address strobe bar signal/RAS, a column address strobe bar signal/CAS, a write enable signal/WE, a chip selection bar signal/CS and a clock enable signal CKE in order to control the EMRS decoder 700.

Figure 7:
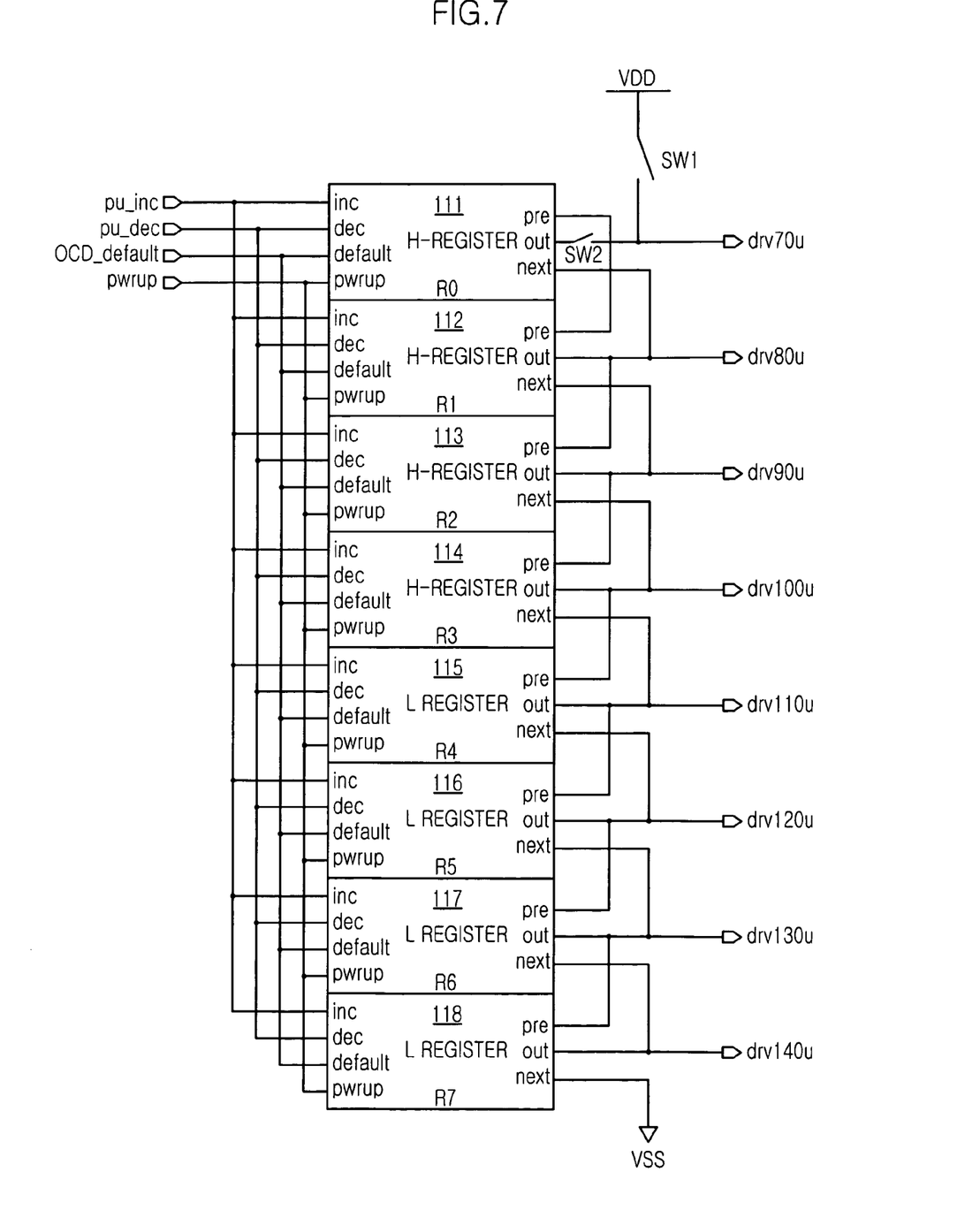
FIG. 7 is a block diagram showing a pull-up OCD control logic unit shown in FIG. 6.

FIG. 7 is a block diagram showing the pull-up OCD control logic unit 110a shown in FIG. 6.

As shown, the pull-up OCD control logic unit 110a includes a first to a fourth initial-high registers 111 to 114 and a first to a fourth initial-low registers 115 to 118 for outputting the first to the eighth pull-up driver impedance adjust signals drv70u to drv140u in response to the pull-up increase signal pu_inc and the pull-up decrease signal pu_dec to thereby adjust the output impedance of the pull-up driver 210.

At initial operation, the pull-up OCD control logic unit 110a activates and outputs predetermined pull-up driver impedance adjust signals among the first to the eights pull-up driver impedance adjust signals drv70u to drv140u, e.g., the first to the fourth pull-up driver impedance adjust signals drv70u to drv100u, in response to an OCD default control signal OCD_default. After that, the pull-up OCD control logic unit 110a controls the number of activated pull-up driver impedance adjust signals among the first to the eighth pull-up driver impedance adjust signals drv70u to drv140u in response to the pull-up increase signal pu_inc and the pull-up decrease signal pu_dec.

A power-up signal pwrup serves as an enable signal for the first to the fourth initial-high registers 111 to 114 and the first to the fourth initial-low register 115 to 118.

An output signal of the first initial-high register 111 is outputted as the pull-up driver impedance adjust signal drv70u or a power supply voltage VDD is outputted as the first pull-up driver impedance adjust signal drv70u depending on a first switch SW1 and a second switch SW2.

At least, the first pull-up driver impedance adjust signal drv70u among first to the eighth pull-up driver impedance adjust signals drv70u to drv140u should be activated. Therefore, the second switch SW2 outputs the power voltage VDD to the drv70u to thereby always activate the drv70u.

Meanwhile, a structure of the pull-up OCD control logic unit 110a is same as that of the pull-down OCD control logic 110b. Therefore, a block diagram of the pull-down OCD control logic 110b is omitted.

Figure 8:
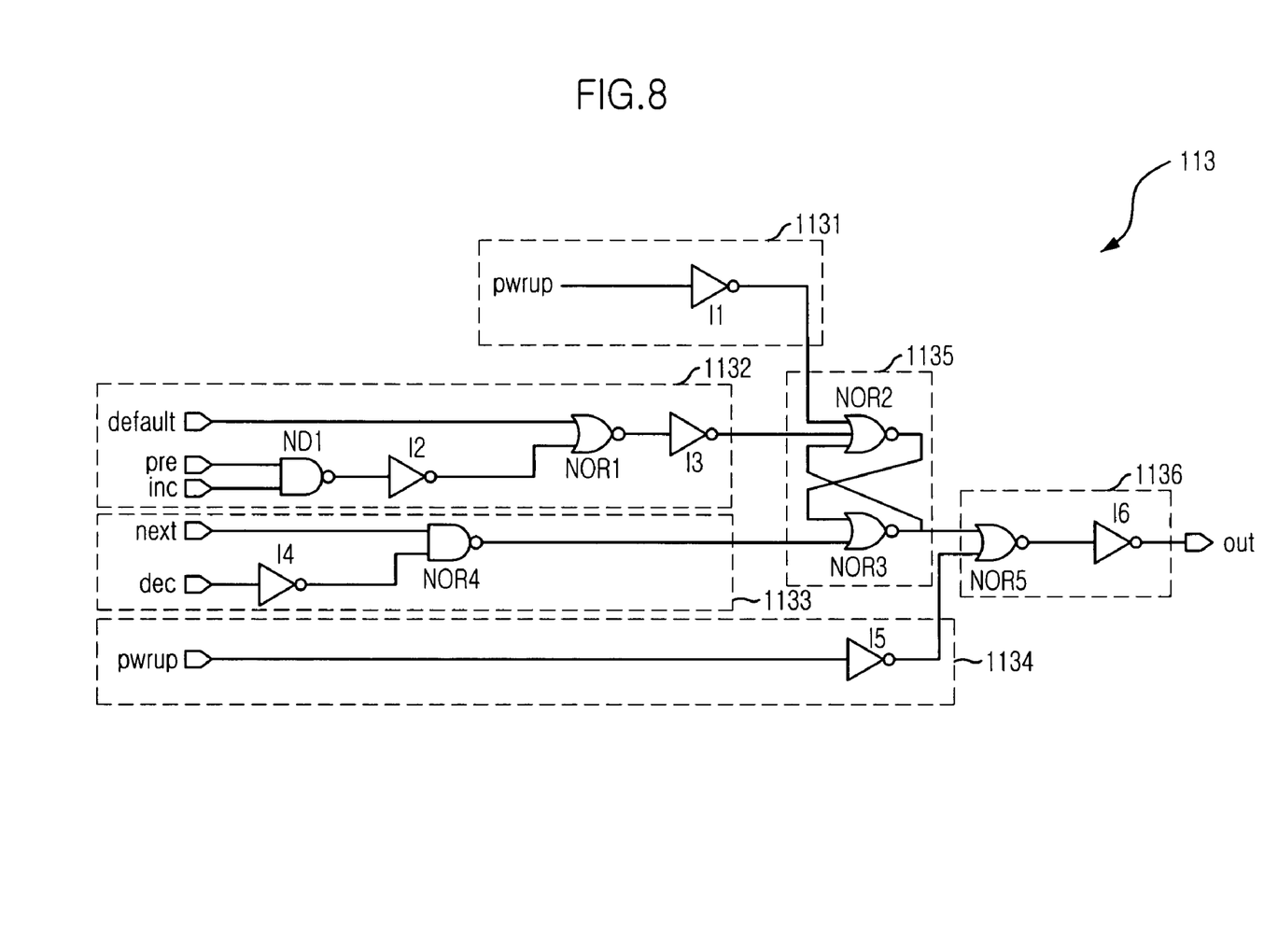
FIG. 8 is a schematic circuit diagram showing one of H-registers included in the pull-up OCD control logic unit shown in FIG. 6.

FIG. 8 is a schematic circuit diagram showing one of the first to the fourth initial-high registers included in the pull-up OCD control logic unit 110a.

As shown, the third initial-high register 113 includes a first enable buffer unit 1131, a second enable buffer unit 1134, a first signal input unit 1132, a second signal input unit 1133, a first RS flip-flop unit 1135 and a first signal output unit 1136.

The first signal input unit 1132 receives the OCD default control signal OCD_default through a default input terminal DEFAULT and outputs the OCD default control signal OCD_default after buffering it. The first signal input unit 1132 also performs a logic NAND operation on the pull-up increase signal pu_inc and an output signal from a previous initial-high register, i.e., from the second initial-high register 112 in this case, then, outputs a resultant.

The second signal input unit 1133 performs a logic NAND operation on an inverted signal of the pull-up decrease signal pu_dec and an output signal from a next initial-high register, i.e., from the fourth initial-high register 114 in this case, then, outputs a resultant.

The first RS flip-flop unit 1135 receives output signals from the first and second signal input unit 1132 and 1133 as its input signals; and is enabled by the power-up signal pwrup.

The first signal output unit 1136 is enabled by the power-up signal pwrup and buffers an outputted signal from the first RS flip-flop unit 1135 to thereby output the buffered signal as an output signal of the third initial-high register 113, i.e., the third pull-up driver impedance adjust signal drv90u.

The first and second enable buffer units 1131 and 1134 serve to transfer the power-up signal pwrup to the first RS flip-flop unit 1135 and the first signal output unit 1136 respectively.

Figure 9:
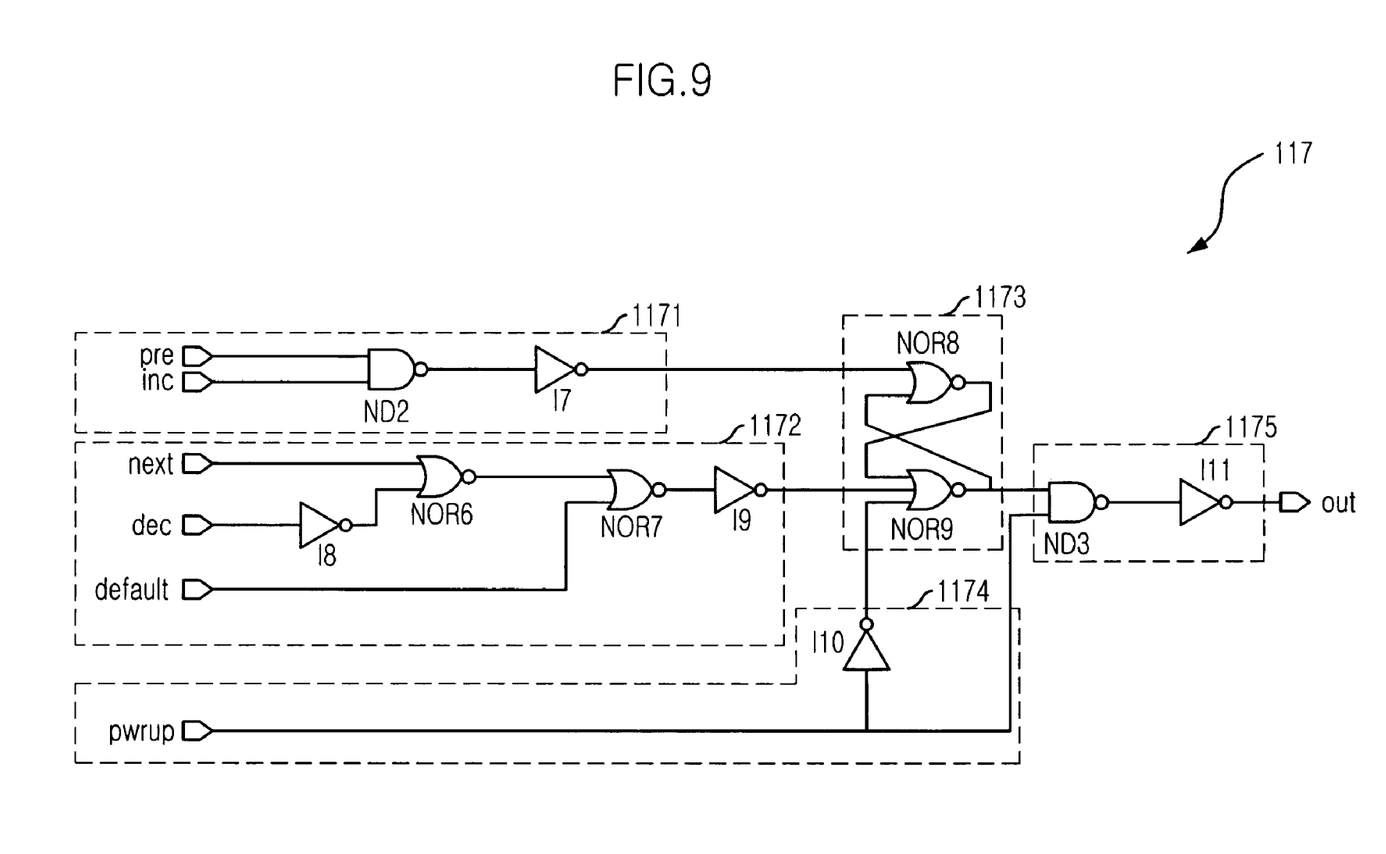
FIG. 9 is a schematic circuit diagram showing one of L-registers included in the pull-up OCD control logic unit shown in FIG. 6.

FIG. 9 is a schematic circuit diagram showing one of the first to the fourth initial-low registers included in the pull-up OCD control logic unit 110a.

As shown, the 117 includes a third signal input unit 1171, a fourth signal input unit 1172, a second RS flip-flop unit 1173, a third enable buffer unit 1174 and a second signal output unit 1175.

The third signal input unit 1171 performs a logic NAND operation on the pull-up increase signal pu_inc and an outputted signal from a previous register, i.e., from the second initial-low register 116 in this case; and, then, outputs a resultant.

The fourth signal input unit 1172 receives the OCD default control signal OCD_default through the default input terminal DEFAULT and output the OCD default control signal OCD_default after buffering it. The fourth signal input unit 1172 also performs a logic NOR operation on an inverted pull-up decrease signal pu_dec and an outputted signal from a next register; and, then, outputs a resultant.

The second RS flip-flop unit 1173 is enabled by the power signal pwrup and receives outputted signals from the third and fourth signal input units 1171 and 1172.

The second signal output unit 1175 is enabled by the power-up signal pwrup and buffers an outputted signal from the second RS flip-flop unit 1173 to thereby output the buffered signal as an output signal of the third initial-low register 117, i.e., the seventh pull-up driver impedance adjust signal drv130u.

Figure 10:
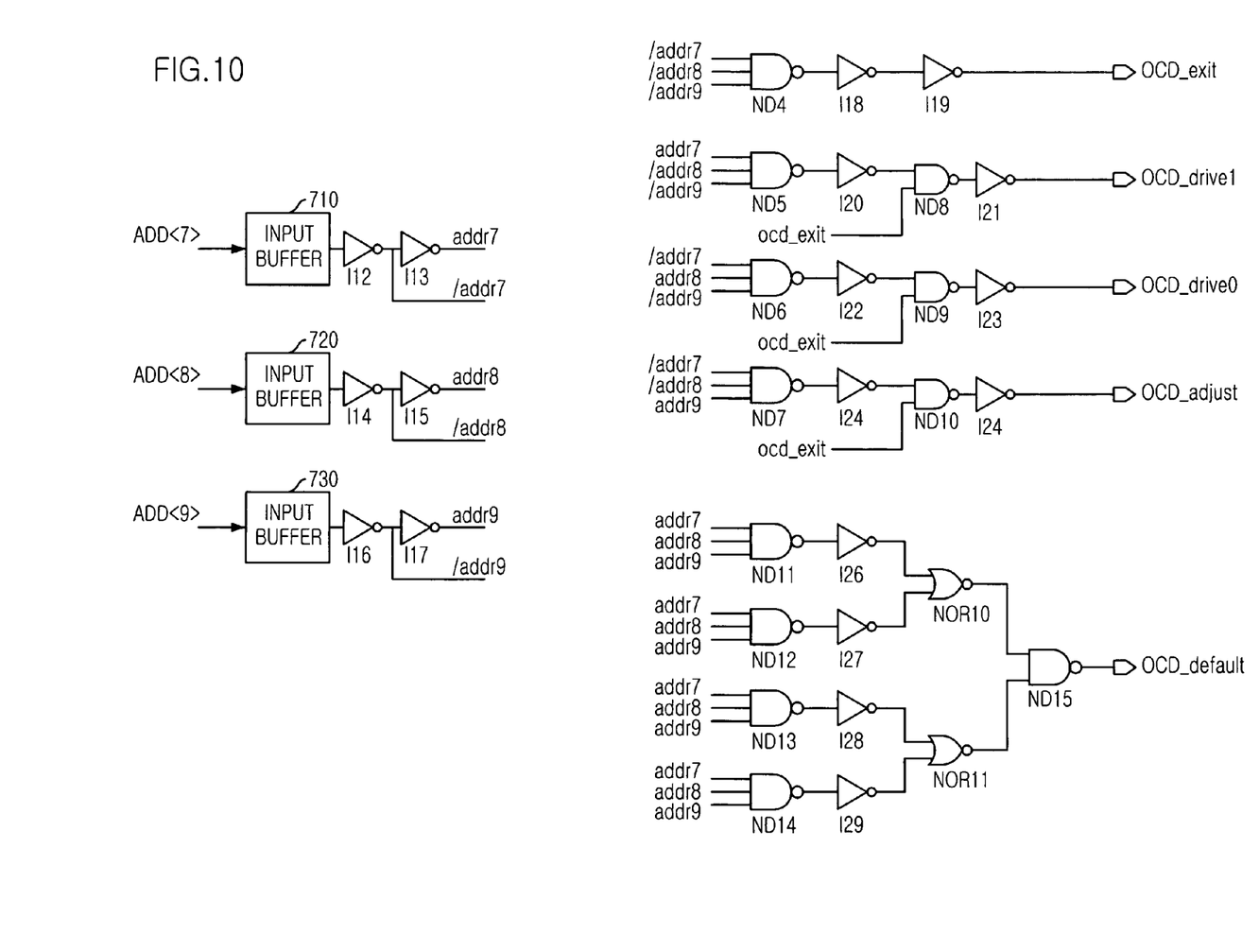
FIG. 10 is a schematic circuit diagram showing an EMRS decoder shown in FIG. 6.

FIG. 10 is a schematic circuit diagram showing the EMRS decoder 700 shown in FIG. 6.

The EMRS decoder 700 receives the 3-bit control code through the address pins ADD<9:7>, i.e., a first address pin ADD<7>, a second address pin ADD<8> and a third address pin ADD<9>; and decodes the 3-bit control code to output control signals, i.e., an OCD exit control signal OCD_exit, an OCD first drive mode control signal OCD_drive1, an OCD second drive mode control signal OCD_drive0, an OCD adjust control signal OCD_adjust and the OCD default control signal OCD_default.

The OCD exit control signal OCD_exit, the OCD first drive mode control signal OCD_drive1, the OCD second drive mode control signal OCD_drive0, the OCD adjust control signal OCD_adjust and the OCD default control signal OCD_default control the synchronous semiconductor memory device to be operated as shown in FIG. 3B.

The OCD exit control signal OCD_exit serves for the synchronous semiconductor memory device to be exit from the OCD calibration control operation. The OCD first drive mode control signal OCD_drive1 serves to adjust the output impedance of the pull-up driver 210 and the OCD second drive mode control signal OCD_drive0 serves to adjust the output impedance of the pull-down driver 220.

The OCD adjust control signal OCD_adjust serves for the synchronous semiconductor memory device to enter an impedance adjustment mode for adjusting the output impedance of the data output driver 200 during the OCD calibration control operation.

The OCD default control signal OCD_default sets the output impedance of the data output driver as a default value.

Figure 11:
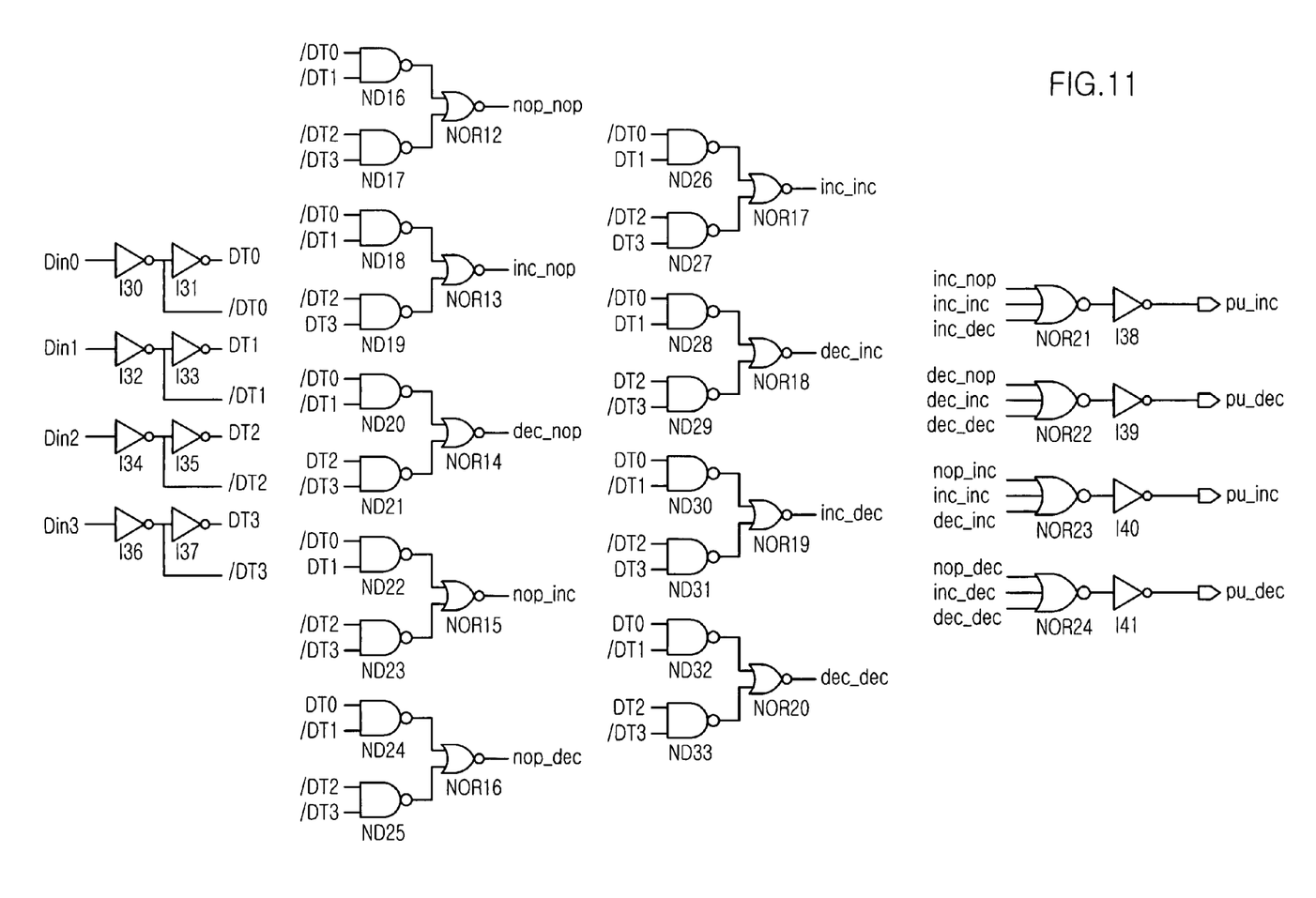
FIG. 11 is a schematic circuit diagram showing the OCD control code signal decoder 120 shown in FIG. 6.

FIG. 11 is a schematic circuit diagram showing the OCD control code signal decoder 120 shown in FIG. 6.

As above described, the OCD control code signal decoder 120 decodes the 4-bit OCD control code signal outputted from the data align unit 400 to generate the pull-up increase signal pu_inc, the pull-down increase signal pd_inc, the pull-up decrease signal pu_dec and the pull-down decrease signal pd_dec for the synchronous semiconductor memory device to be operated as shown in FIG. 4B.

Referring to FIGS. 5 to 11, an operation of the synchronous semiconductor memory device in accordance with the preferred embodiment of the present invention described below.

The OCD calibration control operation is one of concepts proposed by the JEDEC to improve a data input/output speed as described above.

The OCD calibration control operation serves to adjust an output impedance of a data output driver so that the data output driver can have optimized output impedance.

Therefore, a semiconductor memory device, to embody the OCD calibration control operation, should be provided with an OCD control code input pin, an OCD control code input unit and a control unit for decoding an OCD control code signal to adjust the output impedance of the data output driver.

As shown in FIG. 5, the synchronous semiconductor memory device in accordance with the present invention does not include the OCD control code input unit separately but uses a data input unit as the OCD control code input unit.

The synchronous semiconductor memory device receives the data signal through the DQ pad and transfers the data signal to the memory core 500 during the data access operation, or receives the 4-bit OCD control code signal through the DQ pad to decode the 4-bit OCD control code signal for adjusting the output impedance of the data output driver 200 during the OCD calibration control operation.

After the output impedance of the data output driver 200 is optimized by the OCD calibration control operation, the data output driver 200 outputs the data signal outputted from the memory core 500.

The command signal decoder 800 decodes the plurality of command signals to inform the EMRS decoder 700 that the synchronous semiconductor memory device is in the OCD calibration control operation.

Thereafter, the EMRS decoder 700 activates and outputs the OCD first drive mode control signal OCD_drive1 to adjust the output impedance of the pull-up driver 210 in response to the 3-bit control code inputted as 001 through address pins ADD<9:7>.

After the OCD first drive mode control signal OCD_drive1 is activated, the pull-up driver 210 outputs the data signal as a logic high level and the output impedance of the pull-up driver 210 is measured at this time.

Thereafter, the EMRS decoder 700 activates and outputs the OCD adjust control signal OCD_adjust in response to the 3-bit control code inputted as 100 through address pins ADD<9:7>.

After the OCD adjust control signal OCD_adjust is activated, the 4-bit OCD control code signal is inputted through the DQ pad. The 4-bit OCD control code signal is transferred to the OCD control code signal decoder 120 through the data input unit 300 and the data align unit 400.

Thereafter, the OCD control code signal decoder 120 decodes the 4-bit OCD control code signal to control the pull-up OCD control logic unit 110*a*. Then, the pull-up OCD control logic unit 110*a* outputs the first to the eighth pull-up driver impedance adjust signals drv70*u* to drv140*u*.

The pull-up driver 210 adjusts its output impedance in response to the first to the eighth pull-up driver impedance adjust signals drv70*u* to drv140*u*. Adjusting the output impedance of the pull-up driver 210 is performed by controls the number of turned-on MOS transistors among whole MOS transistors included in the pull-up driver 210.

Thereafter, the pull-up driver 210 outputs the data signal as a logic high level having adjusted output impedance.

Likewise, the pull-down driver 220 adjusts its output impedance.

As above described, the synchronous semiconductor memory device in accordance with the present invention does not include an additional input/output pin and an additional path for inputting the OCD control code signal but uses the DQ pad and the data input unit for inputting the OCD control code signal. Therefore, it is possible to embody the OCD calibration control operation minimizing a size of the synchronous semiconductor memory device.

The present application contains subject matter related to Korean patent application No. 2003-58733, filed in the Korean Patent Office on Oct. 25, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, having ability of adjusting an output impedance of a data output driver by performing an OCD calibration control operation, comprises:
    a data input/output pad;
    a data input unit for buffering and latching a data signal inputted through the data input/output pad during a data access operation, or for buffering and latching an OCD control code signal inputted through the data input/output pad during the OCD calibration control operation;
    a data align unit for aligning the data signal latched by the data input unit and transferring the aligned data signal to a memory core during the data access operation, or for aligning and outputting the OCD control code signal latched by the data input unit during the OCD calibration control operation;
    a data output driver for outputting and driving the data signal outputted from the memory core; and
    an OCD control unit for decoding the OCD control code signal outputted from the data align unit to thereby adjust an output impedance of the data output driver.

2. The semiconductor memory device as recited in claim 1, wherein the data output driver outputs the data signal through the data input/output pad.

3. The semiconductor memory device as recited in claim 1, wherein the data input unit includes:
    a data input buffer for buffering the data signal or the OCD control code signal inputted through the data input/output pad; and
    a data latch unit for latching the data signal or the OCD control code signal buffered by the data input buffer.

4. The semiconductor memory device as recited in claim 1, wherein the data align unit includes:
    a normal data align unit for aligning the data signal latched by the data latch unit to thereby output the aligned data signal to the memory core; and
    an OCD code align unit for aligning the OCD code signal latched by the data latch unit to thereby output the aligned OCD code signal to the OCD control unit.

5. The semiconductor memory device as recited in claim 1, wherein the OCD control unit includes:
    an OCD control code signal decoder for decoding the OCD control code signal outputted from the data align unit to thereby output an increase control signal for increasing the output impedance of the data output driver or a decrease control signal for decreasing the output impedance of the data output driver; and an OCD control logic unit for generating a plurality of impedance adjust signals for adjusting the output impedance of the data output driver to thereby output the plurality of impedance adjust signals to the data output driver in response to the increase control signal or the decrease control signal.

6. The semiconductor memory device as recited in claim 5, wherein the data output driver is provided with a plurality of MOS transistors connected in parallel and controls the number of turned-on MOS transistors among the plurality of MOS transistors in response to the plurality of impedance adjust signals outputted from the OCD control logic unit.

7. The semiconductor memory device as recited in claim 5, wherein the data output driver includes:

a pull-up driver for pull-up driving the data input/output pad after receiving a first level data signal outputted from the memory core; and a pull-down driver for pull-down driving the data input/output pad after receiving a second level data signal outputted from the memory core.

8. The semiconductor memory device as recited in claim 7, wherein the OCD control logic unit includes:

a pull-up OCD control logic unit for outputting a plurality of first impedance adjust signals to the pull-up driver in response to a first increase control signal and a first decrease control signal outputted from the OCD control code signal decoder; and a pull-down OCD control logic unit for outputting a plurality of second impedance adjust signals to the pull-down driver in response to a second increase control signal and a second decrease control signal outputted from the OCD control code signal decoder.

* * * * *